(12) United States Patent
Konoshita et al.

(10) Patent No.: US 9,088,255 B2
(45) Date of Patent: Jul. 21, 2015

(54) SENSING DEVICES AND DISPLAY DEVICES USING A PLURALITY OF DIFFERENTIAL AMPLIFIERS AND SENSING CIRCUITS TO MINIMIZE THE TIME TO DETECT PRESENCE OF AN OBJECT

(75) Inventors: Shinji Konoshita, Chu-Nan (TW);
Yoshikazu Matsui, Chu-Nan (TW);
Kazuyuki Hashimoto, Chu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 771 days.

(21) Appl. No.: 13/210,320

(22) Filed: Aug. 15, 2011

(65) Prior Publication Data
US 2013/0043942 A1    Feb. 21, 2013

(51) Int. Cl.
*H03F 3/45* (2006.01)
*G06F 3/044* (2006.01)
*G06F 3/033* (2013.01)
*G06F 3/045* (2006.01)
*G06F 3/041* (2006.01)

(52) U.S. Cl.
CPC ............ *H03F 3/45475* (2013.01); *G06F 3/044* (2013.01); *G06F 3/045* (2013.01); *G06F 3/0416* (2013.01); *H03F 2203/45138* (2013.01)

(58) Field of Classification Search
CPC ........................................................ H03F 3/45
See application file for complete search history.

(56) References Cited

U.S. PATENT DOCUMENTS

| 2006/0097991 | A1* | 5/2006 | Hotelling et al. | 345/173 |
| 2008/0012835 | A1* | 1/2008 | Rimon et al. | 345/173 |
| 2010/0060610 | A1* | 3/2010 | Wu | 345/174 |
| 2010/0321313 | A1* | 12/2010 | Oda et al. | 345/173 |

* cited by examiner

*Primary Examiner* — Joseph Feild
*Assistant Examiner* — K. Kiyabu
(74) *Attorney, Agent, or Firm* — Liu & Liu

(57) ABSTRACT

A sensing device is provided. The sensing device successively operates in a plurality of operation periods and includes a plurality of first electrodes, a plurality of differential amplifiers, and a plurality of sensing circuits. The first electrodes are disposed successively. The differential amplifiers at least comprise a first differential amplifier and a second differential amplifier. Each of the differential amplifiers comprises a first input terminal and a second input terminal. Each of the sensing circuits has an input terminal and an output terminal. The sensing circuits at least comprise first, second, and third sensing circuits. The input terminals of the sensing circuits are coupled to the first electrodes. The output terminals of sensing circuits are coupled to the differential amplifiers. The output terminal of at least one of the sensing circuits is coupled to both of the first differential amplifier and the second differential amplifier.

13 Claims, 15 Drawing Sheets

FIG. 2

| Receiving electrodes | P1 | P2 | P3 | P4 | P5 | P6 | P7 | P8 | P9 | P10 |
|---|---|---|---|---|---|---|---|---|---|---|
| R20 | 100_2 | 100_3 | 100_3 | | | | | | | S22↑ |
| R19 | 100_2 | 100_3 | 100_3 | | | | | | S21↑ | 100_1 |
| R18 | 100_3 | | | | | | | S22↑ | 100_1 | 100_1 |
| R17 | 100_3 | | | | | | S21↑ | 100_1 | 100_1 | 100_2 |
| R16 | | | | | | S22↑ | 100_1 | 100_1 | 100_2 | 100_2 |
| R15 | | | | | S21↑ | 100_1 | 100_1 | 100_2 | 100_2 | 100_3 |
| R14 | | S22↑ | | S22↑ | 100_1 | 100_1 | 100_2 | 100_2 | 100_3 | 100_3 |
| R13 | | 100_1 | S21↑ | 100_1 | 100_1 | 100_2 | 100_2 | 100_3 | 100_3 | |
| R12 | | 100_1 | 100_1 | 100_1 | 100_2 | 100_2 | 100_3 | 100_3 | | |
| R11 | | 100_2 | 100_1 | 100_2 | 100_2 | 100_3 | 100_3 | | | |
| R10 | | 100_2 | 100_2 | 100_2 | 100_3 | 100_3 | | | | |
| R9 | | 100_3 | 100_2 | 100_3 | 100_3 | | | | | |
| R8 | | 100_3 | 100_3 | 100_3 | | | | | | |
| R7 | | | 100_3 | | | | | | | |
| R6 | | | | | | | | | | |
| R5 | | | | | | | | | | |
| R4 | | | | | | | | | | |
| R3 | S21↑ | | | | | | | | | |
| R2 | 100_1 | | | | | | | | | |
| R1 | 100_1 | | | | | | | | | |

Operation periods

FIG. 2

| Receiving electrodes | Operation periods | | | | | | | | |
|---|---|---|---|---|---|---|---|---|---|
| | P1 | P2 | P3 | P4 | P5 | P6 | P7 | P8 | P9 |
| R18 | 100_2 | 100_2 | 100_2 | | | | | | S42↑ |
| R17 | 100_2 | 100_2 | 100_3 | | | | | S41↑ | 100_1 |
| R16 | 100_2 | 100_3 | 100_3 | | | | S41↑ | 100_1 | 100_1 |
| R15 | 100_3 | 100_3 | 100_3 | | | S42↑ | 100_1 | 100_1 | 100_1 |
| R14 | 100_3 | 100_3 | | | | 100_1 | 100_1 | 100_1 | 100_2 |
| R13 | 100_3 | | | | | 100_1 | 100_1 | 100_2 | 100_2 |
| R12 | | | | | | 100_1 | 100_2 | 100_2 | 100_2 |
| R11 | | | | | S41↑ | 100_2 | 100_2 | 100_2 | 100_3 |
| R10 | | | | S41↑ | 100_1 | 100_2 | 100_2 | 100_3 | 100_3 |
| R9 | | | S42↑ | 100_1 | 100_1 | 100_2 | 100_3 | 100_3 | 100_3 |
| R8 | | | 100_1 | 100_1 | 100_1 | 100_3 | 100_3 | 100_3 | |
| R7 | | | 100_1 | 100_1 | 100_2 | 100_3 | 100_3 | | |
| R6 | | | 100_1 | 100_2 | 100_2 | 100_3 | | | |
| R5 | | S41↑ | 100_2 | 100_2 | 100_2 | | | | |
| R4 | S41↑ | 100_1 | 100_2 | 100_2 | 100_3 | | | | |
| R3 | 100_1 | 100_1 | 100_2 | 100_3 | 100_3 | | | | |
| R2 | 100_1 | 100_1 | 100_3 | 100_3 | 100_3 | | | | |
| R1 | 100_1 | 100_2 | 100_3 | 100_3 | | | | | |

FIG. 4

| Receiving electrodes | Operation periods | | | | | |
|---|---|---|---|---|---|---|
| | P1 | P2 | P3 | P4 | P5 | P6 |
| R18 | 100_3 | 100_3 | | | | S62↑ |
| R17 | 100_3 | 100_4 | | | | 100_1 |
| R16 | 100_4 | 100_4 | | | S61↑ | 100_1 |
| R15 | 100_4 | | | | 100_1 | 100_2 |
| R14 | | | | S62↑ | 100_1 | 100_2 |
| R13 | | | | | 100_2 | 100_3 |
| R12 | | | | | 100_2 | 100_3 |
| R11 | | | S61↑ | 100_1 | 100_3 | 100_4 |
| R10 | | S62↑ | 100_1 | 100_1 | 100_3 | 100_4 |
| R9 | | | 100_1 | 100_2 | 100_4 | |
| R8 | | | 100_2 | 100_2 | 100_4 | |
| R7 | | | 100_2 | 100_3 | | |
| R6 | | | 100_3 | 100_3 | | |
| R5 | S61↑ | 100_1 | 100_3 | 100_4 | | |
| R4 | 100_1 | 100_1 | 100_4 | 100_4 | | |
| R3 | 100_1 | 100_2 | 100_4 | | | |
| R2 | 100_2 | 100_2 | | | | |
| R1 | 100_2 | 100_3 | | | | |

FIG. 6

SENSING DEVICES AND DISPLAY DEVICES USING A PLURALITY OF DIFFERENTIAL AMPLIFIERS AND SENSING CIRCUITS TO MINIMIZE THE TIME TO DETECT PRESENCE OF AN OBJECT

BACKGROUND OF THE INVENTION

1. Field of the Invention

The invention relates to a sensing device, and more particularly to a sensing device with differential capacitance/resistance measurement.

2. Description of the Related Art

A conventional sensing device comprises a sensing array and a detection unit. The sensing array is composed of horizontal sensing electrodes and vertical sensing electrodes, wherein the horizontal sensing electrodes interlace with the vertical sensing electrodes. When an object, such as a finger or a stylus, approaches the sensing array, the detection unit can measure capacitances/resistances related to the sensing electrodes to detect the presence of the object and further to determine touch coordinates or a touch position of the object. The capacitances/resistances measured by the detection unit may be mutual-capacitances formed around crossover points of pairs of interlaced horizontal and vertical sensing electrodes, self-capacitances formed between horizontal/vertical sensing electrodes and the object, or resistances formed between horizontal/vertical sensing electrodes and a counter electrode. During the operation of the sensing device, the coupling of noise onto the horizontal and vertical sensing electrodes from surrounding environment may cause errors. Thus, a differential measurement for the capacitances/resistances related to the sensing electrodes is provided to eliminate noise from the surrounding environment.

For the conventional differential measurement, a detection unit comprises only one differential amplifier, and the differential amplifier is coupled to a pair of sensing electrodes to individually generate output signals representing capacitances (mutual-capacitance or self-capacitance)/resistances. In order to measure all of the capacitances/resistances generated in the sensing array, the differential amplifier continuously switches to be coupled to a different pair of sensing electrodes. Thus, for a sensing device with a large sensing array, a detection unit comprising only one differential amplifier takes a long time to measure all capacitances/resistance generated in a sensing array of the sensing device for detecting the presence of an object.

BRIEF SUMMARY OF THE INVENTION

An exemplary embodiment of a sensing device is provided. The sensing device successively operates in a plurality of operation periods and comprises a plurality of first electrodes, a plurality of differential amplifiers, and a plurality of sensing circuits. The plurality of first electrodes are disposed successively. The plurality of differential amplifiers at least comprise a first differential amplifier and a second differential amplifier. Each of the plurality of differential amplifiers comprises a first input terminal and a second input terminal. Each of the plurality of sensing circuits has an input terminal and an output terminal. The plurality of sensing circuits at least comprise first, second, and third sensing circuits. The input terminals of the sensing circuits are coupled to the first electrodes. The output terminals of sensing circuits are coupled to the differential amplifiers. The output terminal of at least one of the plurality of sensing circuits is coupled to both of the first differential amplifier and the second differential amplifier.

An exemplary embodiment of a display device comprises a sensing device. The sensing device successively operates in a plurality of operation periods and comprises a plurality of first electrodes, a plurality of differential amplifiers, and a plurality of sensing circuits. The plurality of first electrodes are disposed successively. The plurality of differential amplifiers at least comprise a first differential amplifier and a second differential amplifier. Each of the plurality of differential amplifiers comprises a first input terminal and a second input terminal. Each of the plurality of sensing circuits has an input terminal and an output terminal. The plurality of sensing circuits at least comprise first, second, and third sensing circuits. The output terminals of the sensing circuits are coupled to the plurality of differential amplifiers. The output terminal of at least one of the plurality of sensing circuits is coupled to both of the first differential amplifier and the second differential amplifier.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 2 shows coupling between electrode sets and sensing circuits of the sensing device of FIGS. 1a-1c in each operation period;

FIG. 4 shows coupling between electrode sets and sensing circuits of the sensing device of FIGS. 3a-3d in each operation period;

FIG. 6 shows coupling between electrode sets and sensing circuits of the sensing device of FIGS. 5a-5c in each operation period;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
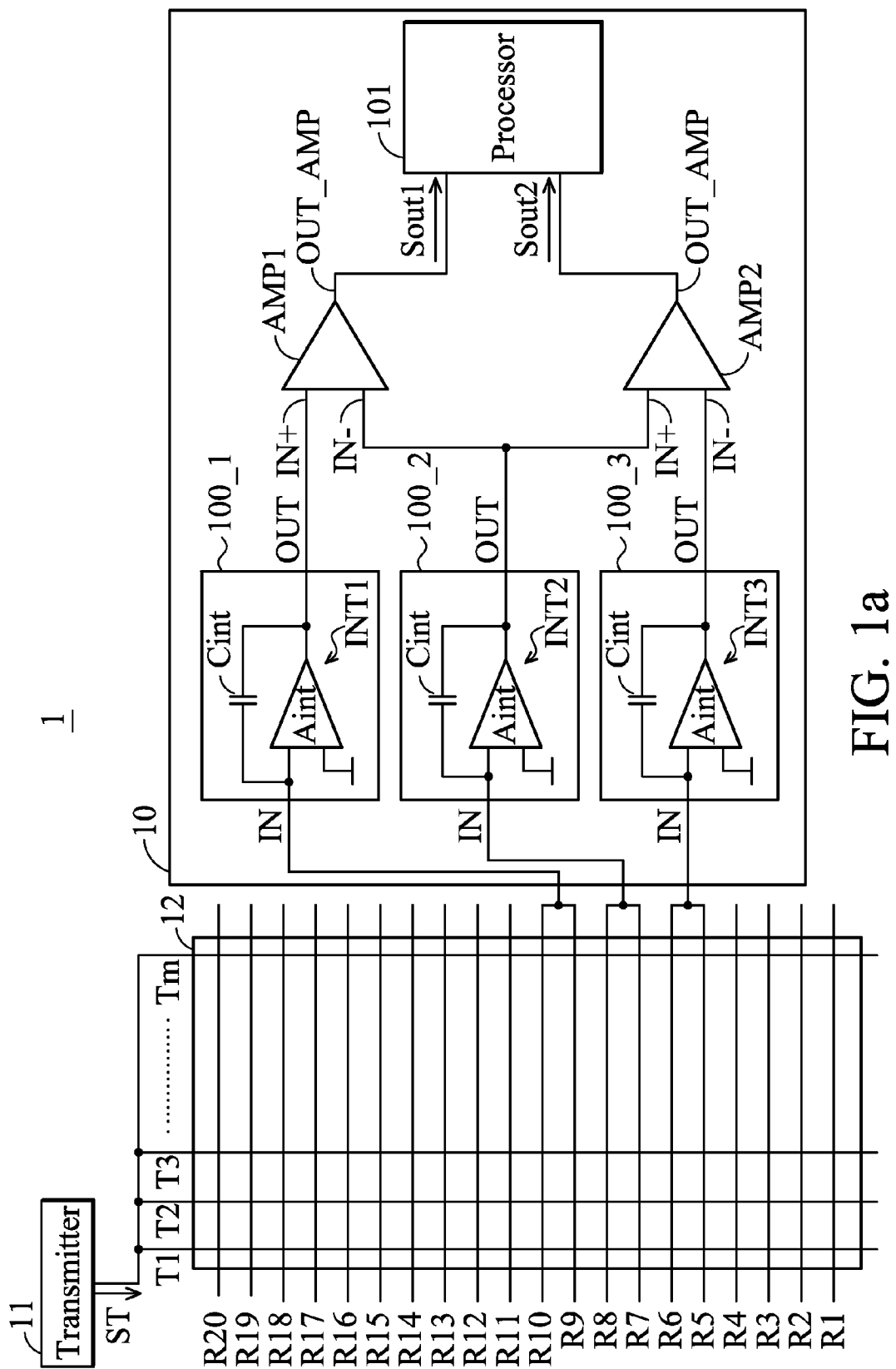
FIGS. 1a-1c show an exemplary embodiment of a sensing device operating in operation periods.

Sensing devices are provided. In an exemplary embodiment of a sensing device in FIG. 1a, a sensing device 1 comprises a plurality of transmitting electrodes T1-Tm, a plurality of receiving electrodes R1-Rn, a detection unit 10, and a transmitter 11, wherein both of m and n are integers. The transmitting electrodes T1-Tm are disposed successively, and the receiving electrodes R1-Rn disposed successively. The transmitting electrodes T1-Tm interlace with the receiving electrodes R1-Rn to form a sensing array 12. In the embodiment, twenty receiving electrodes R1-R20 (n=20) are given as an example. The detection unit 10 comprises a plurality of sensing circuits 100, a plurality of differential amplifiers AMP, and a processor 101. The differential amplifiers AMP operate as analog-to-digital converters. In the embodiment of FIG. 1*a*, three sensing circuits 100_1-100_3 and two differential amplifiers AMP1-AMP2 are given as example. Referring to FIG. 1*a*, the sensing circuits 100_1-100_3 comprise integrators INT1-INT3, respectively, and each of the integrators INT1-INT3 comprises an amplifier Aint and a capacitor Cint. Each of the sensing circuit 100_1-100_3 has an input terminal IN and an output OUT. In each of the integrators INT1-INT3, one input terminal of the amplifier Aint is coupled to the input terminal IN of the corresponding sensing circuit, the other input terminal thereof is coupled to a ground potential of the sensing device 1, and an output terminal thereof is coupled to the output terminal OUT of the corresponding sensing circuit. For the integrator of each of the sensing circuits 100_1-100_3, the capacitor Cint is coupled between the input terminal IN and the output terminal OUT of the corresponding sensing circuit. Each of the differential amplifiers AMP1 and AMP2 has a positive input terminal IN+, a negative input terminal IN−, and an output terminal OUT_AMP. The output terminal OUT of the sensing circuit 100_1 is coupled to the positive input terminal IN+ of the differential amplifier AMP1. The output terminal OUT of the sensing circuit 100_2 is coupled to the negative input terminal IN− of the differential amplifier AMP1 and the positive input terminal IN+ of the differential amplifier AMP2. The output terminal OUT of the sensing circuit 100_3 is coupled to the negative input terminal IN− of the differential amplifier AMP2. The output terminals OUT_AMP of the differential amplifiers AMP1 and AMP2, respectively, generate output signals Sout1 and Sout2 to the processor 101.

The sensing device 1 operates in a plurality of operation periods. In each of the plurality of operation periods, the receiving electrodes having a predetermined number are coupled together to be defined as one electrode set. In the embodiment, the sensing device 1 operates in operation periods P1-P10 as shown in FIG. 2, and two receiving electrodes (the predetermined number=2) are coupled together to be defined as one electrode set. According to the number of sensing circuits, three electrode sets are defined in each of the operation periods P1-P10, and the three electrode sets do not overlap. Each electrode set is coupled to the input terminal IN of one sensing circuit. FIG. 2 shows the coupling between the three electrode sets and the three sensing circuits 100_1-100_3 in each of the operation periods P1-P10. FIG. 2 only shows scanning of the receiving electrodes R1-R20 on the operation period P1-P10 and not scanning of the transmitting electrodes T1-Tm. Referring to FIG. 2, in each of the operation periods P1-P10, the sensing circuit, which each electrode set is coupled to, is represented by the reference number of the corresponding sensing circuit. For example, referring to FIGS. 1*a* and 2, in the operation period P5, the input terminal IN of the sensing circuit 100_1 is coupled to one electrode set, which is defined by the receiving electrodes R9-R10, the input terminal IN of the sensing circuit 100_2 is coupled to one electrode set, which is defined by the receiving electrodes R7-R8, and the input terminal IN of the sensing circuit 100_3 is coupled to one electrode set, which is defined by the receiving electrodes R5-R6.

Figure 1B:
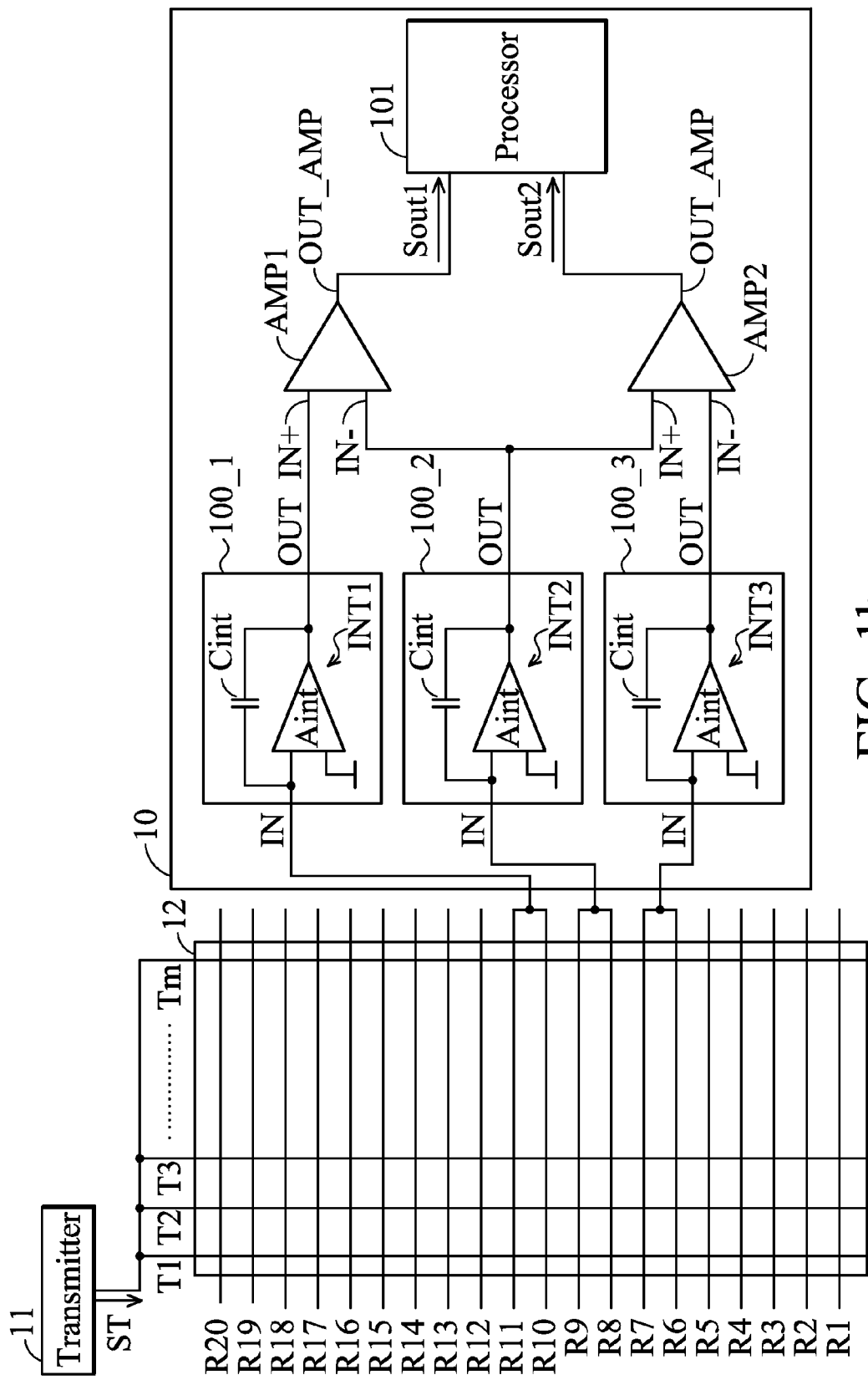

Referring to FIGS. 1*b* and 2, when the sensing device 1 switches to operate in the operation period P6, three electrode sets, respectively, coupled to the input terminals IN of the sensing circuits 100_1-100_3 are re-defined by shifting a step S21, which represents upward shifting of one receiving electrode. According to the shifting of the step S21, the input terminal IN of the sensing circuit 100_1 switches to be coupled to one electrode set, which is defined by the receiving electrodes R10-R11, the input terminal IN of the sensing circuit 100_2 switches to be coupled to one electrode set, which is defined by the receiving electrodes R8-R9, and the input terminal IN of the sensing circuit 100_3 switches to be coupled to one electrode set, which is defined by the receiving electrodes R6-R7.

Figure 1C:
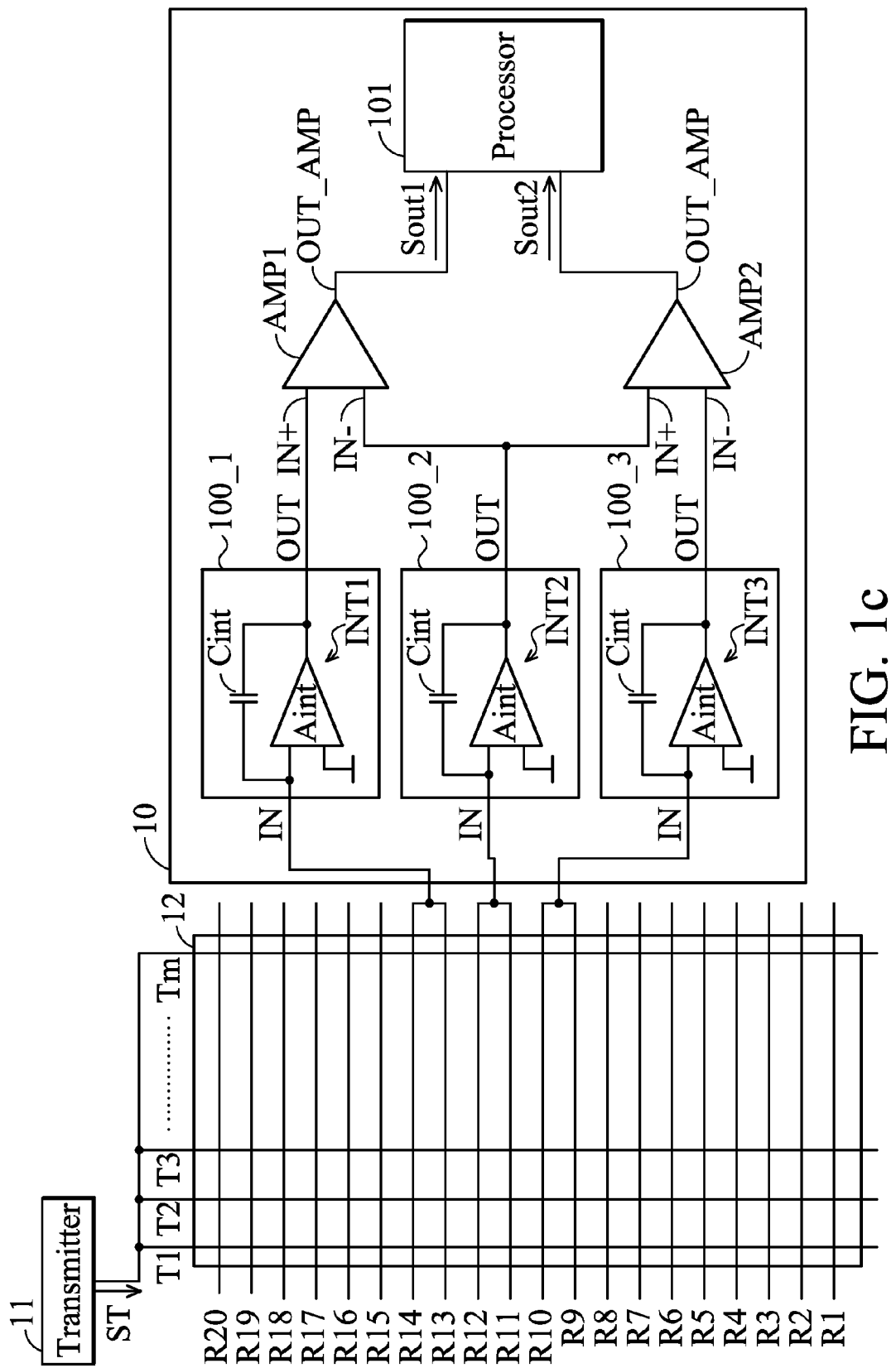

Referring to FIGS. 1*c* and 2, when the sensing device 1 switches to operate in the operation period P7, three electrode sets, respectively, coupled to the input terminals IN of the sensing circuits 100_1-100_3 are re-defined by shifting a step S22, which represents upward shifting of three receiving electrodes. According to the shifting of the step S22, the input terminal IN of the sensing circuit 100_1 switches to be coupled to one electrode set, which is defined by the receiving electrodes R13-R14, the input terminal IN of the sensing circuit 100_2 switches to be coupled to one electrode set, which is defined by the receiving electrodes R11-R12, and the input terminal IN of the sensing circuit 100_3 switches to be coupled to one electrode set, which is defined by the receiving electrodes R9-R10.

Then, referring to FIG. 2, when the sensing device 1 switches to operate in the operation period P8, three electrode sets, respectively, coupled to the input terminals IN of the sensing circuits 100_1-100_3 are re-defined by shifting the step S21 again. In the following operation periods P9-P10, three electrode sets, respectively, coupled to the input terminals IN of the sensing circuits 100_1-100_3 are re-defined in a shift cycle by shifting the step S21 and the step S22. When the operation period P10 is finished, the operation of the sensing device 1 may return to the operation period P1 by shifting the step S22. Then, three electrode sets, respectively, coupled to the input terminals IN of the sensing circuits 100_1-100_3 are re-defined in a shift cycle by repeatedly shifting the step S21 and the step S22 in the following operation periods P2-P10. In the embodiment, the step S22 is greater than the step S21 and serves as the maximum step.

In each of the operation periods P1-P10, the transmitter 11 provides a transmitting signal ST to the transmitting electrodes T1-Tm, and, accordingly, capacitance coupling between the transmitting electrodes T1-Tm and the receiving electrodes R1-R20 is induced. According to the coupling between three electrode sets and the sensing circuits 100_1-100_3 in each of the operation periods P1-P10, the output signals Sout1 and Sout2 generated by the differential amplifiers AMP1 and AMP2 vary in response to the capacitance coupling. Thus, the output signals Sout1 and Sout2 represent mutual-capacitances between the transmitting electrodes T1-Tm and the three electrode sets. The processor 101 receives the output signals Sout1 and Sout2 and detects presence of an object according to the output signals Sout1 and Sout2 when the object contacts the sensing array 12, such that a touch coordinate or a touch position of the object can be determined.

Referring to FIG. 2, in each of the operation periods P1 and P3-P10, the receiving electrodes of each of the three electrode sets are successive. However, in the operation period P2, the receiving electrodes R1 and R20 of the electrode set coupled to the input terminal IN of the sensing circuit 100_2 are not successive.

Figure 3A:
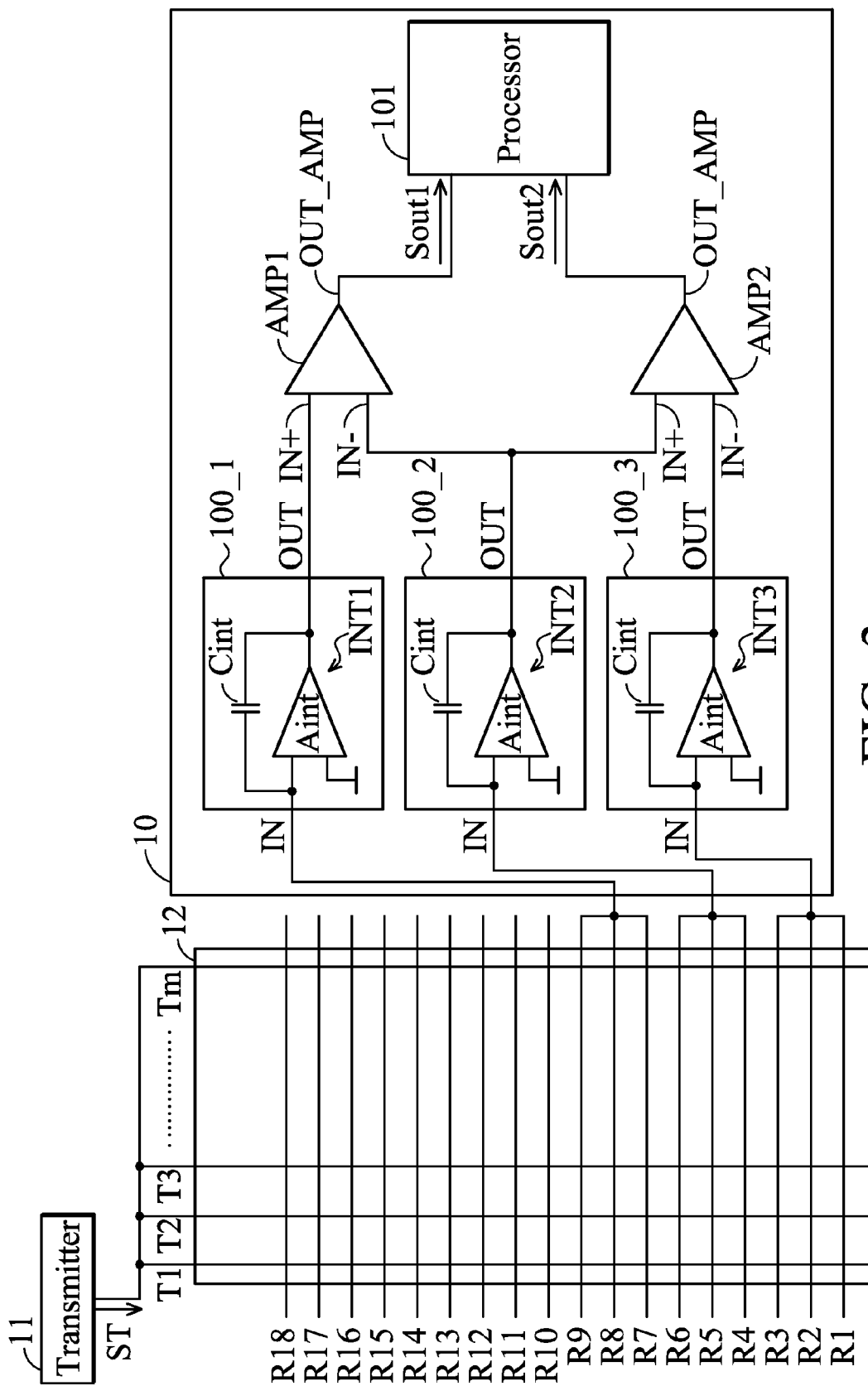
FIGS. 3a-3d show another exemplary embodiment of a sensing device operating in operation periods.

In some embodiments, three receiving electrodes are coupled together to be defined as one electrode set in each operation period. In these embodiments, eighteen receiving electrodes R1-R18 (n=18) are given as an example, and the sensing device 1 operates in nine operation periods P1-P9, as shown in FIGS. 3*a* and 4. Since the number of sensing circuits is not changed, three electrode sets are still defined in each of the operation periods P1-P9, and each electrode set is coupled to the input terminal IN of one sensing circuit. FIG. 4 shows the coupling between the three electrode sets and the three sensing circuits 100_1-100_3 in each of the operation periods P1-P9. FIG. 4 only shows scanning of the receiving electrodes R1-R18 on the operation period P1-P9 is shown and not scanning of the transmitting electrodes T1-Tm. Referring to FIG. 4, in each of the operation periods P1-P9, the sensing circuit, which each electrode set is coupled to, is represented by the reference number of the corresponding sensing circuit. For example, referring to FIGS. 3a and 4, in the operation period P4, the input terminal IN of the sensing circuit 100_1 is coupled to one electrode set, which is defined by the receiving electrodes R7-R9, the input terminal IN of the sensing circuit 100_2 is coupled to one electrode set, which is defined by the receiving electrodes R4-R6, and the input terminal IN of the sensing circuit 100_3 is coupled to one electrode set, which is defined by the receiving electrodes R1-R3.

Figure 3B:
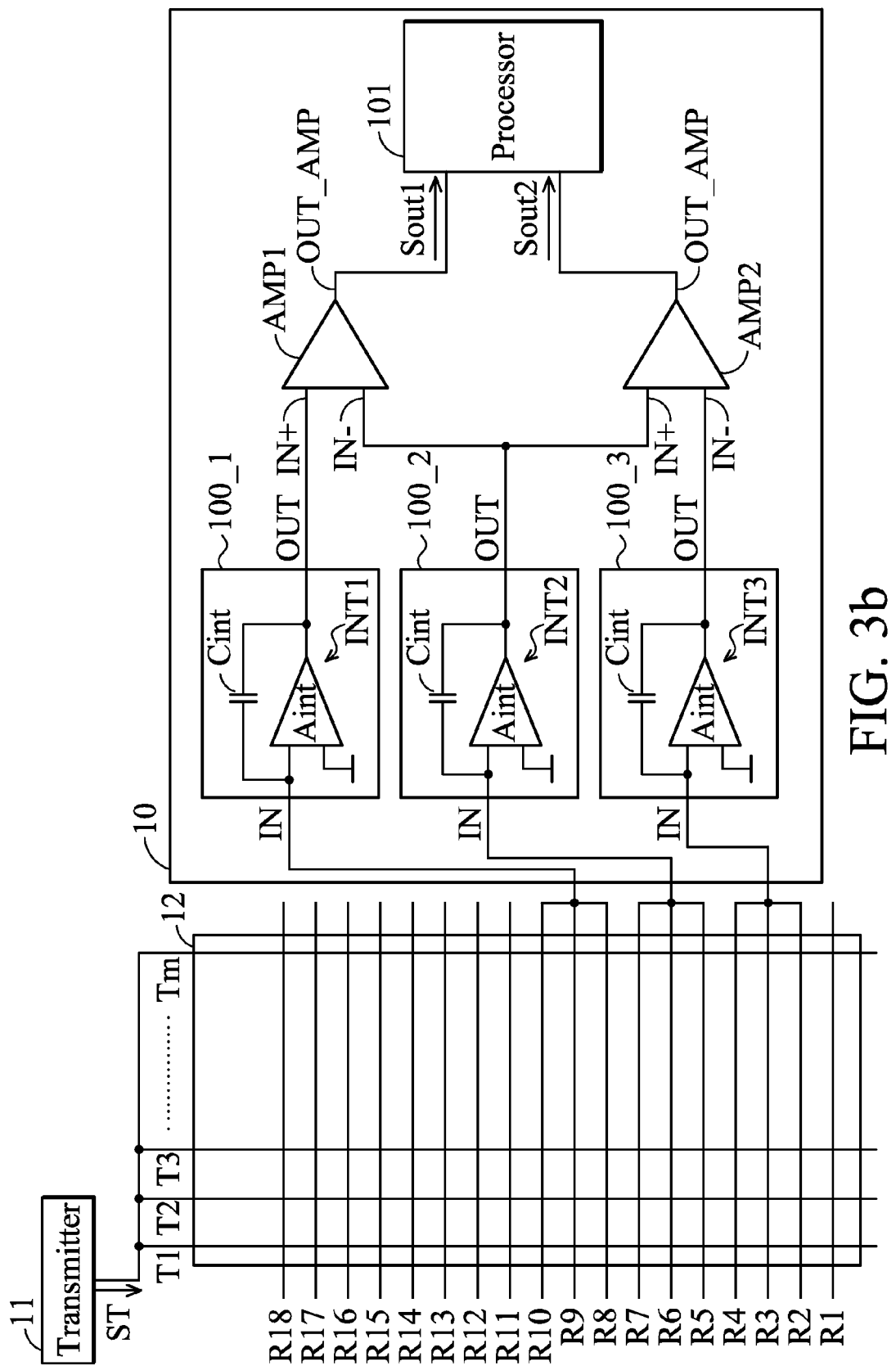

Referring to FIGS. 3b and 4, when the sensing device 1 switches to operate in the operation period P5, three electrode sets, respectively, coupled to the input terminals IN2 of the sensing circuits 100_1-100_3 are re-defined by shifting a step S41, which represents upward shifting of one receiving electrode. According to the shifting of the step S41, the input terminal IN of the sensing circuit 100_1 switches to be coupled to one electrode set, which is defined by the receiving electrodes R8-R10, the input terminal IN of the sensing circuit 100_2 switches to be coupled to one electrode set, which is defined by the receiving electrodes R5-R7, and the input terminal IN of the sensing circuit 100_3 switches to be coupled to one electrode set, which is defined by the receiving electrodes R2-R4.

Figure 3C:
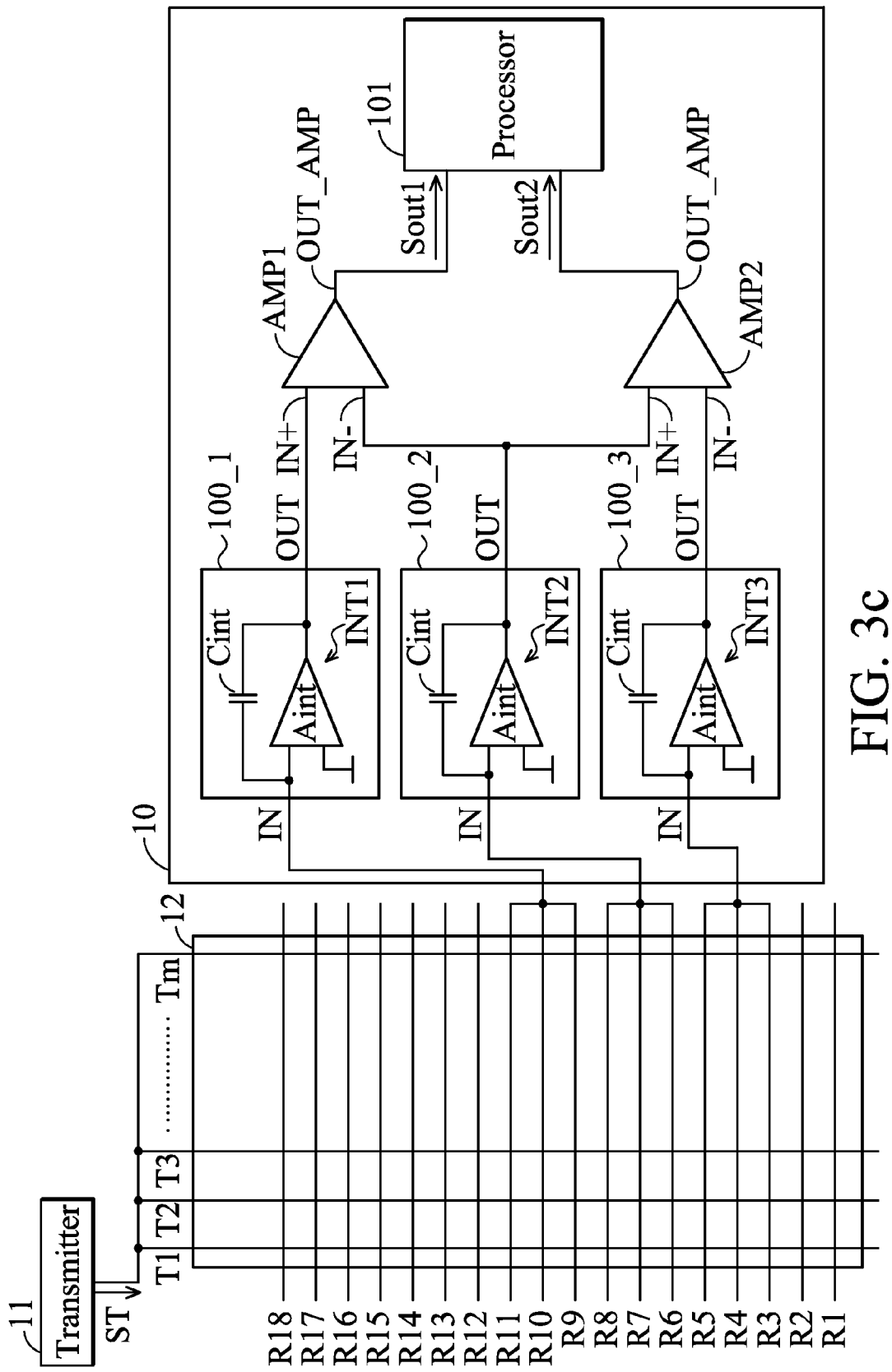

Referring to FIGS. 3c and 4, when the sensing device 1 switches to operate in the operation period P6, three electrode sets, respectively, coupled to the input terminals IN2 of the sensing circuits 100_1-100_3 are re-defined also by shifting the step S41. According to the shifting of the step S41, the input terminal IN of the sensing circuit 100_1 switches to be coupled to one electrode set, which is defined by the receiving electrodes R9-R11, the input terminal IN of the sensing circuit 100_2 switches to be coupled to one electrode set, which is defined by the receiving electrodes R6-R8, and the input terminal IN of the sensing circuit 100_3 switches to be coupled to one electrode set, which is defined by the receiving electrodes R3-R5.

Figure 3D:
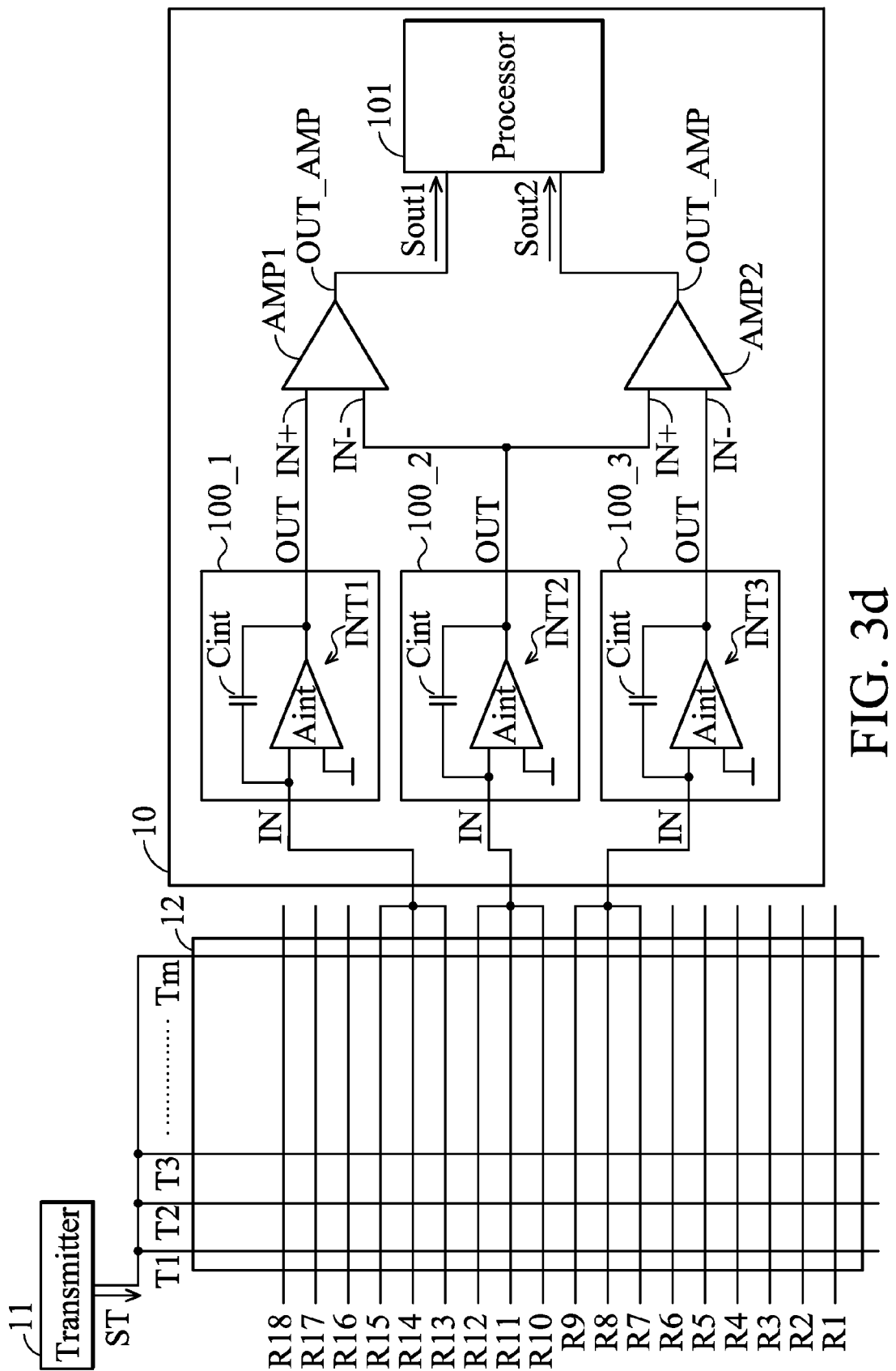

Referring to FIGS. 3d and 2, when the sensing device 1 switches to operate in the operation period P7, three electrode sets, respectively, coupled to the input terminals IN2 of the sensing circuits 100_1-100_3 are re-defined by shifting a step S42 which represents upward shifting of four receiving electrodes. According to the shifting of the step S42, the input terminal IN of the sensing circuit 100_1 switches to be coupled to one electrode set, which is defined by the receiving electrodes R13-R15, the input terminal IN of the sensing circuit 100_2 switches to be coupled to one electrode set, which is defined by the receiving electrodes R10-R12, and the input terminal IN of the sensing circuit 100_3 switches to be coupled to one electrode set, which is defined by the receiving electrodes R7-R9.

Then, referring to FIG. 4, when the sensing device 1 switches to operate in the operation period P8, three electrode sets, respectively, coupled to the input terminals IN2 of the sensing circuits 100_1-100_3 are re-defined by shifting the step S41 again. In the following operation period P9, three electrode sets, respectively coupled to the input terminals IN2 of the sensing circuits 100_1-100_3 are re-defined by shifting the step S41. When the operation period P9 is finished, the operation of the sensing device 1 may return to the operation period P1 by shifting the step S42. Then, the three electrode sets, respectively, coupled to the input terminals IN of the sensing circuits 100_1-100_3 are re-defined in a shift cycle by repeatedly shifting the step S41 and the step S42 in the following operation periods P2-P9. In the embodiment, the step S42 is greater than the step S41 and serves as the maximum step.

Referring to FIG. 4, in each of the operation periods P1 and P4-P9, the receiving electrodes of each of the three electrode sets are successive. However, in the operation periods P2 and P3, the receiving electrodes of one of the three electrode sets are not successive. For example, in the operation period P2, the receiving electrodes R1 and R17-R18 of the electrode set coupled to the input terminal IN of the sensing circuit 100_2 are not successive.

Figure 5A:
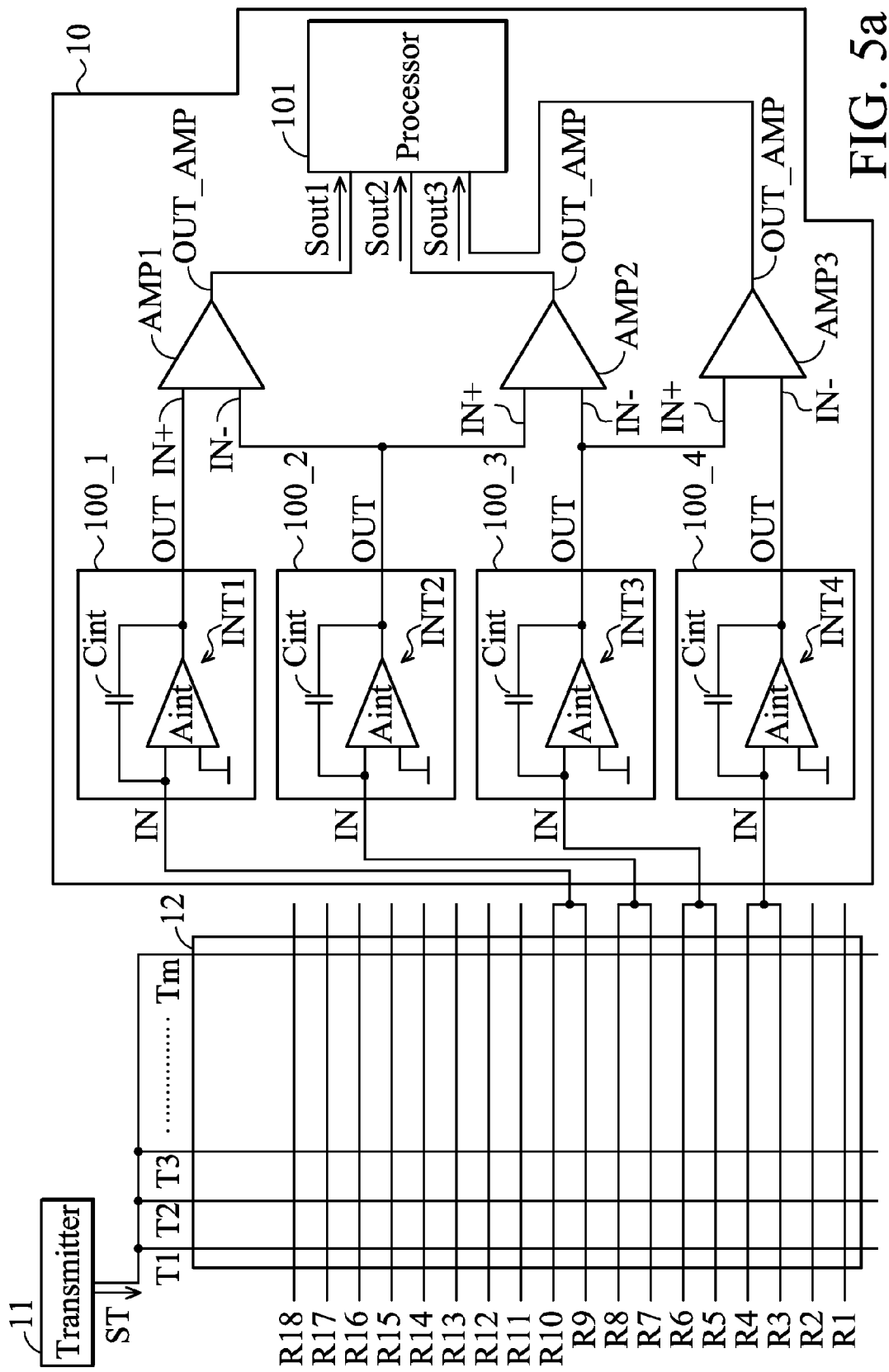
FIGS. 5a-5c show another exemplary embodiment of a sensing device operating in operation periods.

In some other embodiments, as shown in FIG. 5a, the detection unit 10 comprises four sensing circuits and three differential amplifiers. That is, the detection unit 10 further comprises a sensing circuit 100_4 and a differential amplifier AMP3, as compared with FIG. 1a. The sensing circuit 100_4 comprises an integrator INT4 and has the same circuit structure as the sensing circuit 100_1-100_3. The differential amplifier AMP3 has a positive input terminal IN+, a negative input terminal IN−, and an output terminal OUT_AMP. The output terminal OUT of the sensing circuit 100_3 is coupled to not only the negative input terminal IN− of the differential amplifier AMP2 but also the positive input terminal IN+ of the differential amplifier AMP3. The output terminal OUT of the sensing circuit 100_4 is coupled to the negative input terminal IN− of the differential amplifier AMP3. The output terminal OUT_AMP of the differential amplifier AMP3 generates an output signal Sout3 to the processor 101.

In the embodiment of FIG. 5a, two receiving electrodes are coupled together to be defined as one electrode set in each operation period, and eighteen receiving electrodes R1-R18 are given as an example. Accordingly, the sensing device 1 operates in six operation periods P1-P6, as shown in FIG. 6. Since the number of sensing circuits is equal to four, four electrode sets are defined in each of the operation periods P1-P6. The four electrode sets do not overlap. FIG. 6 shows the coupling between the four electrode sets and the three sensing circuits 100_1-100_4 in each of the operation periods P1-P6. FIG. 6 only shows scanning of the receiving electrodes R1-R18 on the operation period P1-P6 is shown and not scanning of the transmitting electrodes T1-Tm. Referring to FIG. 6, in each of the operation periods P1-P6, the sensing circuit, which each electrode set is coupled to, is represented by the reference number of the corresponding sensing circuit. For example, referring to FIGS. 5a and 6, in the operation period P3, the input terminal IN of the sensing circuit 100_1 is coupled to one electrode set, which is defined by the receiving electrodes R9-R10, the input terminal IN of the sensing circuit 100_2 is coupled to one electrode set, which is defined by the receiving electrodes R7-R8, the input terminal IN of the sensing circuit 100_3 is coupled to one electrode set, which is defined by the receiving electrodes R5-R6, and the input terminal IN of the sensing circuit 100_4 is coupled to one electrode set, which is defined by the receiving electrodes R3-R4.

Figure 5B:
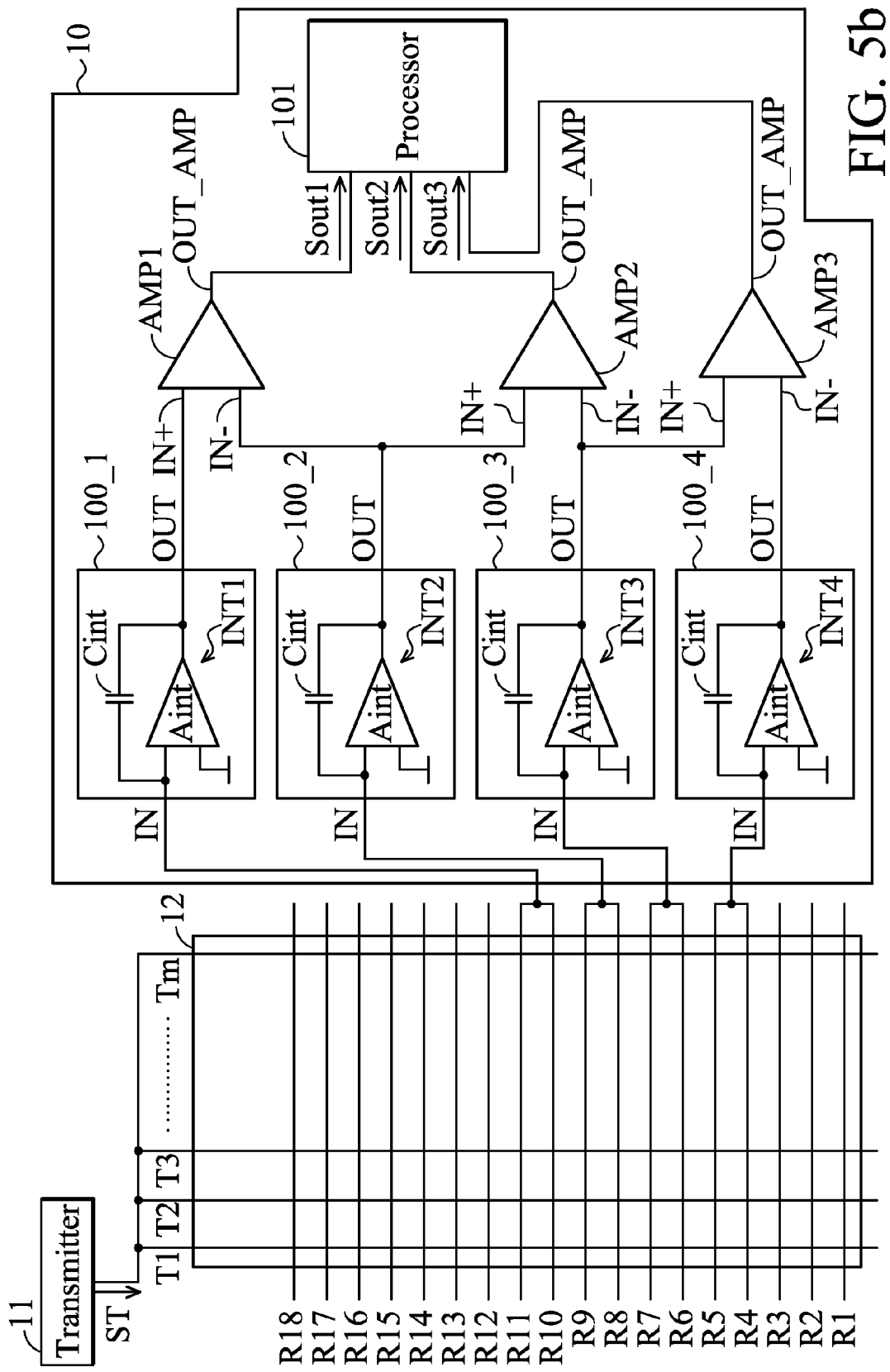

Referring to FIGS. 5b and 6, when the sensing device 1 switches to operate in the operation period P4, four electrode sets, respectively coupled to the input terminals IN of the sensing circuits 100_1-100_4 are re-defined by shifting a step S61 which represents upward shifting of one receiving electrode. According to the shifting of the step S61, the input terminal IN of the sensing circuit 100_1 switches to be coupled to one electrode set, which is defined by the receiving electrodes R10-R11, the input terminal IN of the sensing circuit 100_2 switches to be coupled to one electrode set, which is defined by the receiving electrodes R8-R9, the input terminal IN of the sensing circuit 100_3 switches to be coupled to one electrode set, which is defined by the receiving electrodes R6-R7, and the input terminal IN of the sensing circuit 100_4 switches to be coupled to one electrode set, which is defined by the receiving electrodes R4-R5.

Figure 5C:
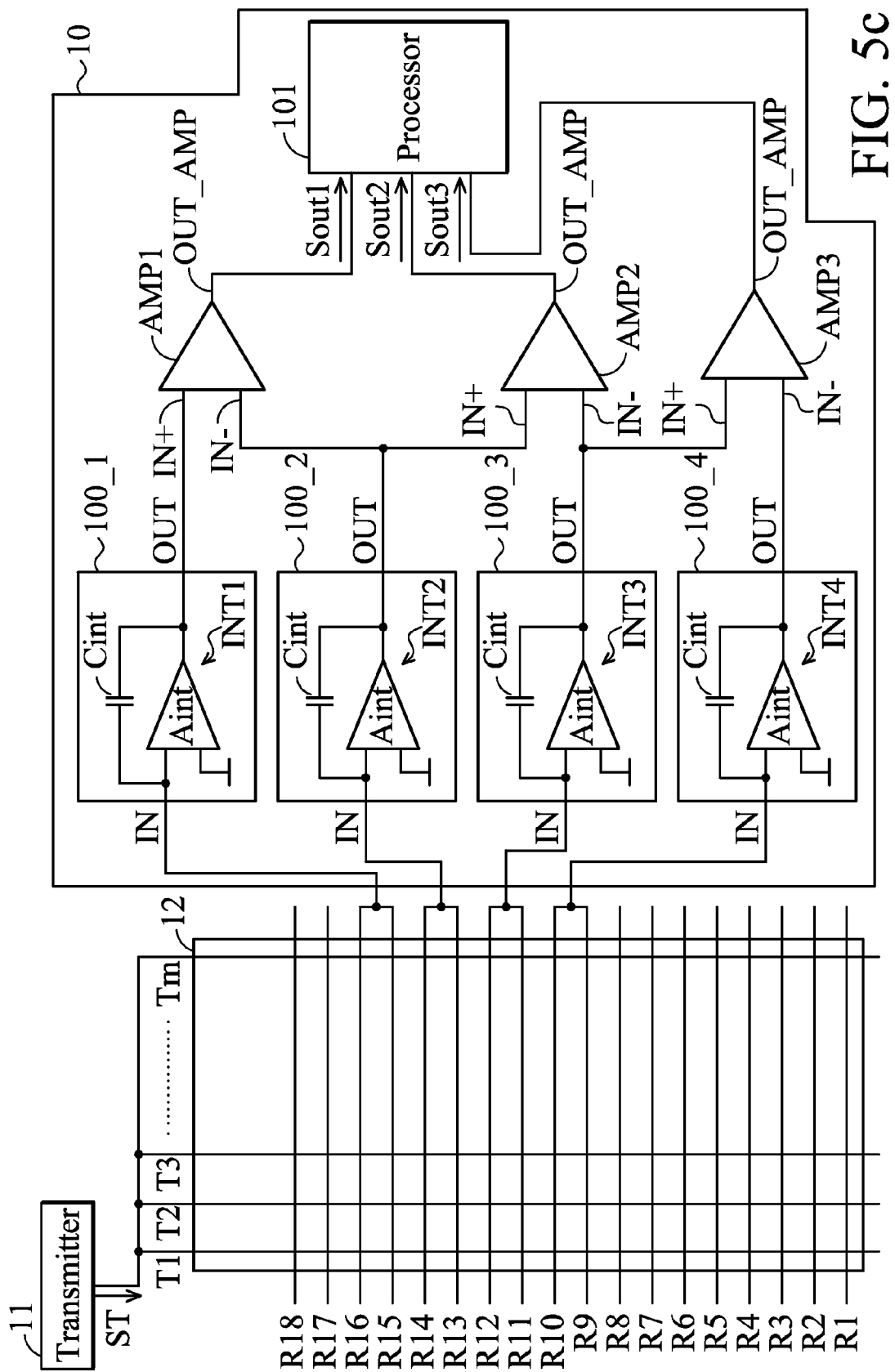

Referring to FIGS. 5c and 6, when the sensing device 1 switches to operate in the operation period P5, four electrode sets, respectively, coupled to the input terminals IN of the sensing circuits 100_1-100_4 are re-defined by shifting a step S62 which represents upward shifting of five receiving electrodes. According to the shifting of the step S62, the input terminal IN of the sensing circuit 100_1 switches to be coupled to one electrode set, which is defined by the receiving electrodes R15-R16, the input terminal IN of the sensing circuit 100_2 switches to be coupled to one electrode set, which is defined by the receiving electrodes R13-R14, the input terminal IN of the sensing circuit 100_3 switches to be coupled to one electrode set, which is defined by the receiving electrodes R11-R12, and the input terminal IN of the sensing circuit 100_4 switches to be coupled to one electrode set, which is defined by the receiving electrodes R9-R10.

Then, referring to FIG. 6, when the sensing device 1 switches to operate in the operation period P6, four electrode sets, respectively, coupled to the input terminals IN of the sensing circuits 100_1-100_4 are re-defined by shifting the step S61 again. When the operation period P6 is finished, the operation of the sensing device 1 may return to the operation period P1 by shifting the step S62. Then, the four electrode sets, respectively, coupled to the input terminals IN of the sensing circuits 100_1-100_4 are re-defined in a shift cycle by repeatedly shifting the step S61 and the step S62 in the following operation periods P2-P6. In the embodiment, the step S62 is greater than the step S61 and serves as the maximum step.

Referring to FIG. 6, in each of the operation periods P1 and P3-P6, the receiving electrodes of each of the three electrode sets are successive. However, in the operation period P2, the receiving electrodes R1 and R18 of the electrode set coupled to the input terminal IN of the sensing circuit 100_3 are not successive.

In each of the operation periods P1-P6, the transmitter 11 also provides a transmitting signal ST to the transmitting electrodes T1-Tm and capacitance coupling between the transmitting electrodes T1-Tm and the receiving electrodes R1-R18 is induced. By the coupling between four electrode sets and the sensing circuits 100_1-100_4 in each of the operation periods P1-P6, the output signals Sout1-Sout3 generated by the differential amplifier AMP1-AMP3 vary in response to the capacitance coupling. Thus, the output signals Sout1-Sout3 represent mutual-capacitances between the transmitting electrodes T1-Tm and the four electrode sets. The processor 101 receives the output signals Sout1-Sout3 and detects presence of an object according to the output signals Sout1-Sout3 when the object contacts the sensing array 12, so that A touch coordinate or a touch position of the object can be determined.

Table 1 shows the relationships between the number of differential amplifiers in the detection unit 10 represented by "X", the number of receiving electrodes coupled to the detection unit 10 in each operation period, and the number of receiving electrodes shifted by the maximum step when two receiving electrodes are coupled together to be defined as one electrode set as shown in the embodiment of FIGS. 1a-1c and 2 and the embodiment of FIGS. 5a-5c and 6.

TABLE 1

| The number of differential amplifiers (X) | the number of coupled receiving electrodes in each operation period | the number of receiving electrodes shifted by the maximum step |
|---|---|---|
| 1 | 4 | 1 |
| 2 | 6 | 3 |
| 3 | 8 | 5 |
| ... | ... | ... |
| X | 2(X + 1) | 2X − 1 |

According to Table 1, in the embodiment of FIGS. 1a-1c and 2, the number of receiving electrodes coupled to the sensing circuits 100_1-100_3 of the detection unit 10 in each of the operation periods P1-P10 is 6, wherein every two receiving electrodes are coupled together to be defined as one electrode set coupled to one of the sensing circuits 100_1-100_3, and three electrode sets are defined. Moreover, the step S22 is the maximum step, which represents upward shifting of three receiving electrodes.

Referring to Table 1, in the embodiment of FIGS. 5a-5c and 6, the number of receiving electrodes coupled to the sensing circuits 100_1-100_4 of the detection unit 10 in each of the operation periods P1-P6 is 8, wherein every two receiving electrodes are coupled together to be defined as one electrode set coupled to one of the sensing circuits 100_1-100_4, and four electrode sets are defined. Moreover, the step S62 is the maximum step, which represents upward shifting of five receiving electrodes.

Figure 7:
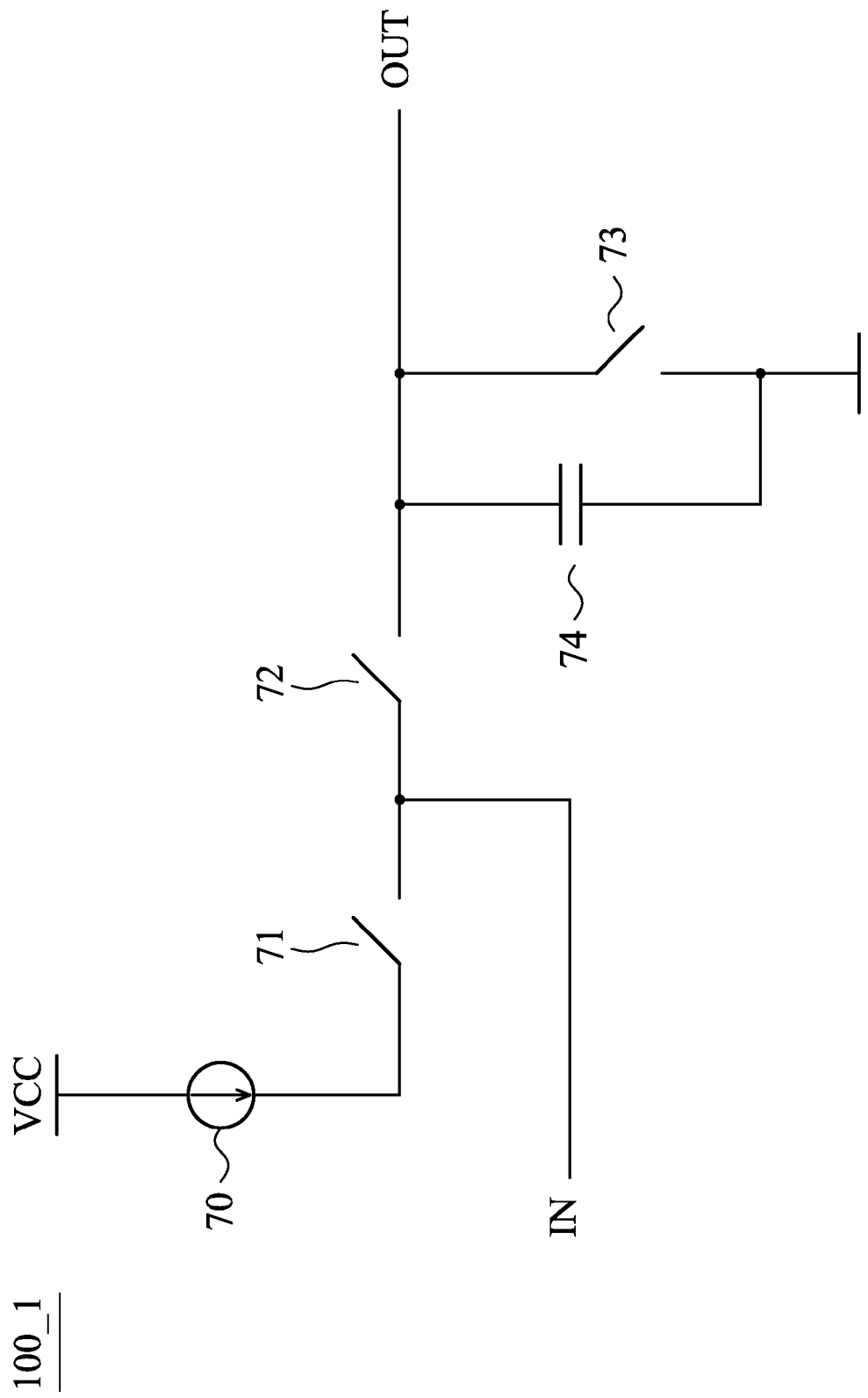
FIG. 7 shows an exemplary embodiment of a sensing circuit of the sensing device.

In the above embodiments, each sensing circuit comprises an integrator for mutual-capacitance measurement. However, in other embodiments, as shown in FIG. 7, each sensing circuit, for example the sensing circuit 100_1, comprises a current source 70, three switches 71-73, and a capacitor 74. The current source 70, the switches 71-73, and the capacitor 74 can operate for self-capacitance between each electrode set and object, such a finger or stylus. For self-capacitance measurement, the transmitter 11 is omitted. Moreover, the detection unit 10 can be coupled to the transmitting electrodes T1-Tm, and the coupling between the transmitting electrodes and the sensing circuits of the detection unit 10 can be accomplished according to the coupling between the receiving electrodes and the sensing circuits of the above embodiments.

Figure 8:
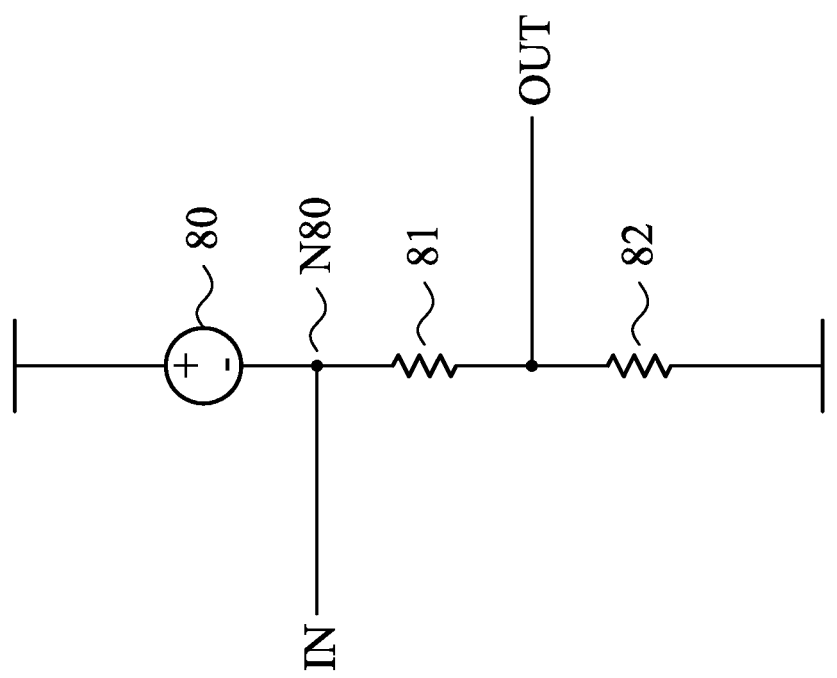
FIG. 8 shows another exemplary embodiment of a sensing circuit of the sensing device.

FIG. 8 shows another exemplary embodiment of a sensing circuit of the sensing device. When sensing circuits are used for resistance measurement, each sensing circuit comprises a voltage source 80 and resistors 81 and 82 which are coupled in series to serve as a resistance-to-voltage conversion circuit. In FIG. 8, the input terminal IN of the sensing circuit is coupled to a node N80 between the voltage source 80 and the resistor 81. In another embodiment, the input terminal IN may be coupled to a node between the resistor 82 and the ground potential. In this case of FIG. 8, the output signals Sout1 and Sout2 represent resistances formed between the defined electrode sets and a counter electrode.

According to the above embodiments, the detection unit 10 comprises several differential amplifiers and several sensing circuits. In the operation periods, the input terminal of each sensing circuit continuously switches to be coupled to one different electrode set by shifting one of two steps of a shift cycle. Thus, the detection unit 10 may take minimal time to measure all capacitances generated in the sensing array 12 to detect the presence of an object, which is advantageous when the sensing array 12 has a large size.

The sensing device of the above embodiments can be applied to any display device. In other words, a display device comprises the sensing device of the embodiments, so that the display device may perform not only a display operation but also a sensing operation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sensing device successively operating in a plurality of operation periods, comprising:
    a plurality of first electrodes disposed successively;
    a plurality of differential amplifiers at least comprising a first differential amplifier and a second differential amplifier, each comprising a first input terminal and a second input terminal; and
    a plurality of sensing circuits each having an input terminal and an output terminal, wherein the plurality of sensing circuits at least comprise first, second, and third sensing circuits;
    wherein the input terminals of the sensing circuits are coupled to the first electrodes; and
    wherein the output terminals of sensing circuits are coupled to the differential amplifiers;
    wherein the output terminal of at least one of the plurality of sensing circuits is coupled to both of the first differential amplifier and the second differential amplifier.

2. The sensing device as claimed in claim 1, wherein in the plurality of operation periods, the first electrodes which are predetermined to be coupled to the plurality of sensing circuits are defined by shifting a first step and a second step of a shift cycle, and the second step is greater than the first step.

3. The sensing device as claimed in claim 2, wherein when the sensing device switches to operate in a first operation period among the plurality of operation periods, each of the plurality of first electrodes which are predetermined to be coupled to the plurality of sensing circuits are re-defined by shifting the first step.

4. The sensing device as claimed in claim 3, wherein when the sensing device switches to operate in a second operation period among the plurality of operation periods from the first operation period, each of the plurality of first electrodes which are predetermined to be coupled to the plurality of sensing circuits are re-defined by shifting the second step.

5. The sensing device as claimed in claim 2, wherein the first electrodes having a predetermined number are coupled together to be defined as one electrode set, and at least first, second, and third electrode sets are defined; and
    wherein the input terminal of the first sensing circuit is coupled to the first electrode set;
    wherein the input terminal of the second sensing circuit is coupled to the second electrode set; and
    wherein the input terminal of the third sensing circuit is coupled to the third electrode set.

6. The sensing device as claimed in claim 5, wherein the output terminal of first sensing circuit is coupled to the first input terminal of the first differential amplifier;
    wherein the output terminal of the second sensing circuit is coupled to both of the second input terminal of the first differential amplifier and the first input terminal of the second differential amplifier, and
    wherein the output terminal of the third sensing circuit is coupled to the second input terminal of the second differential amplifier.

7. The sensing device as claimed in claim 1 further comprising:
    a plurality of second electrodes interlacing with the plurality of first electrodes,
    wherein the first and second differential amplifiers generate output signals representing mutual-capacitances between the plurality of the second electrodes and the plurality of first electrodes.

8. The sensing device as claimed in claim 1, wherein the first electrodes coupled to one of the first to third sensing circuits do not overlap with the first electrodes coupled to the other two of the first to third sensing circuits.

9. The sensing device as claimed in claim 1, wherein the output terminal of the at least one of the plurality of sensing circuits is coupled in parallel to both of the first differential amplifier and the second differential amplifier.

10. A display device comprising:
    a sensing device successively operating in a plurality of operation periods, comprising:
    a plurality of first electrodes disposed successively;
    a plurality of differential amplifiers at least comprising a first differential amplifier and a second differential amplifier, each comprising a first input terminal and a second input terminal; and
    a plurality of sensing circuits each having an input terminal and an output terminal, wherein the plurality of sensing circuits at least comprise first, second, and third sensing circuits,
    wherein the output terminals of the sensing circuits are coupled to the plurality of differential amplifiers, and the output terminal of at least one of the plurality of the sensing circuits is coupled to both of the first differential amplifier and the second differential amplifier.

11. The display device as claimed in claim 10, wherein for each of the first to third sensing circuits, in each of the plurality of the operation periods, the input terminal switches to be coupled to the first electrodes having a predetermined number among the plurality of first electrodes by shifting one of a first step and a second step of a shift cycle, wherein the second step is greater than the first step.

12. The display device as claimed in claim 10, wherein in each of the plurality of operation periods, the first electrodes coupled to one of the first to third sensing circuits do not overlap the first electrodes coupled to the other two of the first to third sensing circuits.

13. The sensing device as claimed in claim 10, wherein the output terminal of the at least one of the plurality of sensing circuits is coupled in parallel to both of the first differential amplifier and the second differential amplifier.

* * * * *